(12) United States Patent
Oon et al.

(10) Patent No.: US 7,488,990 B2
(45) Date of Patent: Feb. 10, 2009

(54) USING MULTIPLE TYPES OF PHOSPHOR IN COMBINATION WITH A LIGHT EMITTING DEVICE

(75) Inventors: Su Lin Oon, Lepas Pulau Pinang (MY); Janet Bee Yin Chua, Penang (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 10/817,359

(22) Filed: Apr. 2, 2004

(65) Prior Publication Data

US 2005/0224828 A1 Oct. 13, 2005

(51) Int. Cl.
*H01L 33/00* (2006.01)
(52) U.S. Cl. .................. 257/98; 257/100; 257/E33.061
(58) Field of Classification Search .................. 257/98, 257/100
See application file for complete search history.

(56) References Cited

U.S. PATENT DOCUMENTS

| | | | |
|---|---|---|---|
| 6,252,254 B1 * | 6/2001 | Soules et al. ................... | 257/89 |
| 6,513,949 B1 * | 2/2003 | Marshall et al. .............. | 362/231 |
| 6,674,233 B2 * | 1/2004 | Ellens et al. ................. | 313/503 |
| 6,680,569 B2 | 1/2004 | Mueller-Mach et al. | |
| 6,696,703 B2 | 2/2004 | Mueller-Mach et al. | |
| 6,696,704 B1 | 2/2004 | Maeda et al. | |
| 2003/0006702 A1 * | 1/2003 | Mueller-Mach et al. ..... | 313/512 |
| 2004/0188697 A1 * | 9/2004 | Brunner et al. ................ | 257/99 |

OTHER PUBLICATIONS

Ali Serpengüzel, "Solid state lamp: The new paradigm in illumination", XXXI IAHS 31, World Congress on Housing, Housing Process & Product, Jun. 23-27, 2003, Montreal Canada.

\* cited by examiner

*Primary Examiner*—Wai-Sing Louie (57) ABSTRACT

Light is emitted from a light emitting device. The light emitted from the light emitting device is combined with light from a first type of phosphor and a second type of phosphor. The first type of phosphor and the second type of phosphor are within an epoxy placed over the light emitting device. The first type of phosphor, when excited, emits light of a first color. The second type of phosphor, when excited, emits light of a second color. The first color and the second color are different.

16 Claims, 7 Drawing Sheets

USING MULTIPLE TYPES OF PHOSPHOR IN COMBINATION WITH A LIGHT EMITTING DEVICE

BACKGROUND

The present invention relates to generation of light and pertains particularly to using multiple types of phosphor in combination with a light emitting device.

A conventional single chip light emitting diode (LED) emits a monochromatic color with high purity. Typical colors emitted are pure blue, pure green, pure yellow or pure red. A white LED is produced by incorporating a photoluminescent material called phosphor together with the LED chip.

The number of colors that can be achieved by a conventional LED are limited. It is difficult, for example, to obtain colors such as greenish white, reddish white, pinkish white or yellowish green. By using the combination of an LED and a colored phosphor, it is possible to obtain a wider variety of colors. For example, by combining a phosphor that emits yellow light with a blue LED, it is possible to obtain a range of colors from white to bluish white to yellow light. Likewise, using a combination of green phosphor and a blue LED chip, it is possible to obtain a bluish-green color. However, there is a limit to colors that can be achieved by such a combination of blue light with a single color phosphor. For example, yellowish-green and greenish-white colors cannot be produced by a known combination of a blue LED light and a single color phosphor.

SUMMARY OF THE INVENTION

In accordance with embodiments of the present invention, light is emitted from a light emitting device. The light emitted from the light emitting device is combined with light from a first type of phosphor and a second type of phosphor. The first type of phosphor and the second type of phosphor are within an epoxy placed over the light emitting device. The first type of phosphor, when excited, emits light of a first color. The second type of phosphor, when excited, emits light of a second color. The first color and the second color are different.

DESCRIPTION OF THE EMBODIMENT

Figure 1:
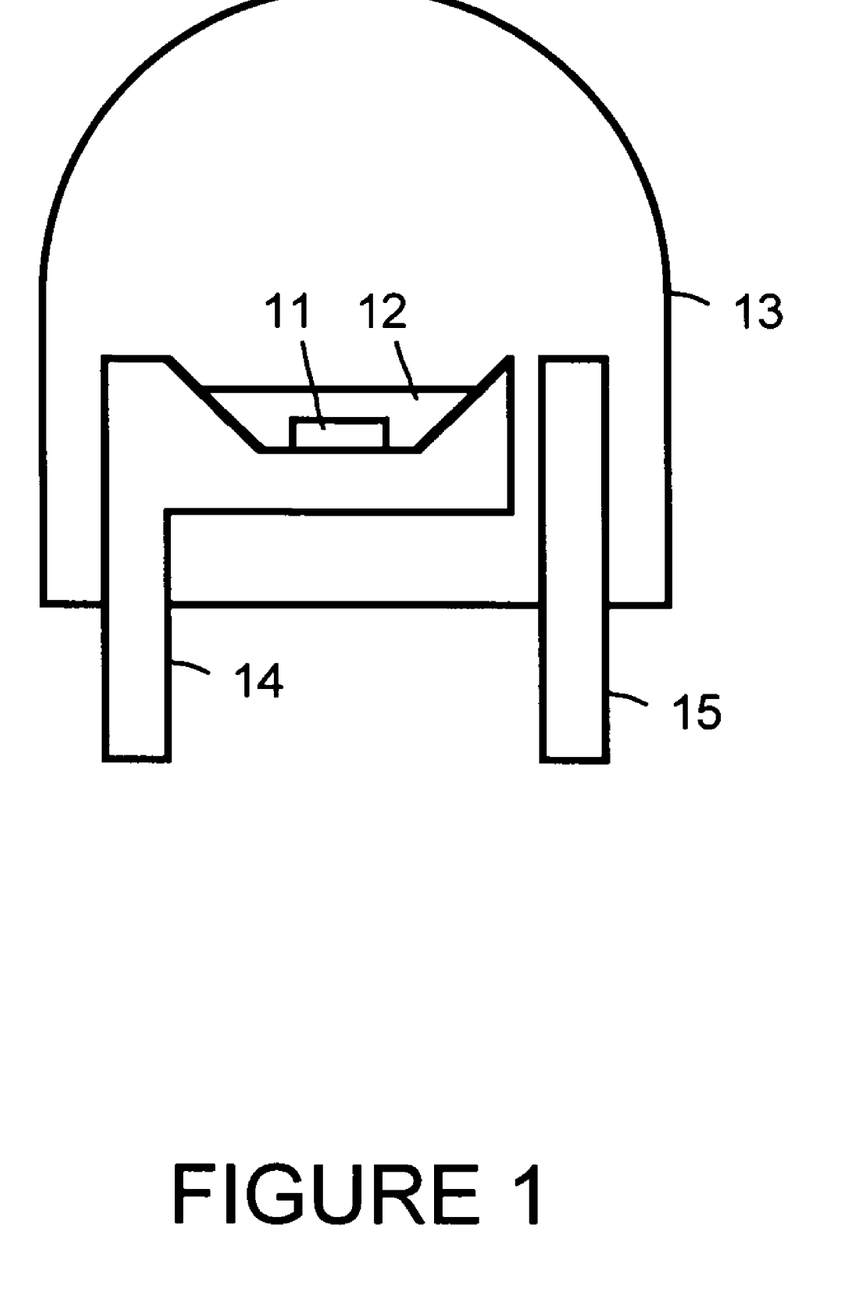
FIG. 1 shows a light emitting device, surrounded by an epoxy that includes multiple types of phosphor, packaged as a through-hole lamp in accordance with an embodiment of the present invention.

FIG. 1 shows a through-hole lamp that includes a liquid encapsulation epoxy 13, a pin 14 and a pin 15. A light emitting device 11 is mounted within the through-hole lamp. Light emitting device 11 is covered by an epoxy 12 that includes multiple types of phosphor. For example, epoxy 12 is a liquid epoxy that includes green phosphor and yellow phosphor. For example light emitting device 11 is a blue light emitting diode (LED). Alternatively, other color phosphors and/or LED may be utilized.

The mixture of green phosphor plus yellow phosphor plus blue LED allows color ranges from bluish-green to greenish-white to yellowish-green to be obtained. By adjusting the mixture and ratio of green phosphor and yellow phosphor, a wide variety of colors in this color spectrum can be obtained.

For example, the green phosphor is Strontium Thiogallate: Europium, having a chemical formula of $SrGa_2S_4$:Eu. The green phosphor is spherical in shape and has a mean particle size ranging from 1 micron (μm) to 30 μm. The green phosphor can be efficiently excited by a blue light source generating a blue light with a wavelength from a range of 460 nanometers (nm) to 480 nm. Thus excited, the green phosphor emits green light with peak emission at a wavelength of 535 nm (CIE 1931 color coordinates x=0.270, y=0.683). Alternatively, the green phosphor can have a different chemical formula. For example, the green phosphor can include $BaGa_4S_7$:Eu, or a wider coverage of the thiogallate phosphor that is a mix group II alkaline metal thiogallate phosphor $(Sr,Ca,Ba)(Al,Ga)_2S_4$:Eu; $BaSrGa_4S_7$:Eu.

For example, the yellow phosphor has a chemical formula of $Tb_3Al_5O_{12}$:Ce. The yellow phosphor is spherical in shape and has a mean particle size ranging from 1 μm to 30 μm. The yellow phosphor can be efficiently excited by a blue light source generating a blue light with a wavelength from a range of 460 nanometers (nm) to 480 nm. Thus excited, the yellow phosphor emits yellow light with peak emission at a wavelength of 575 nm (CIE 1931 color coordinates x=0.467, y=0.522). Alternatively, the yellow phosphor can include a silicate based phosphor such as $Sr(Ba,Ca)SiO_4$:Eu or can also include YAG:Ce.

For example, light emitting device 11 emits blue light with peak wavelength ranges from 460 nm to 480 nm.

In another embodiment of the invention, using red phosphor, for example in combination with yellow phosphor, allows other color ranges to be obtained. For example, the red phosphor can be composed of a sulfide based phosphor such as one of the following: $CaS:Eu^{2+},Mn^{2+}$; $SrS:Eu^{2+}$; $(Zn,Cd)S:Ag^+$; $ZnS: Cu^+$; $ZnSe:Cu, Cl$; $ZnSe_{1/2}S_{1/2}:Cu,Cl$. The red phosphor can also be nitride base with, for example, a chemical formula of: $(Ca,Sr,Ba)_2Si_5N_8:Eu^{2+}$; $BaSi_7N_{10}:Eu^{2+}$. The red phosphor also can be composed of other phosphors such as $Mg_4GeO_{5.5}F:Mn^{4+}$.

Figure 2:
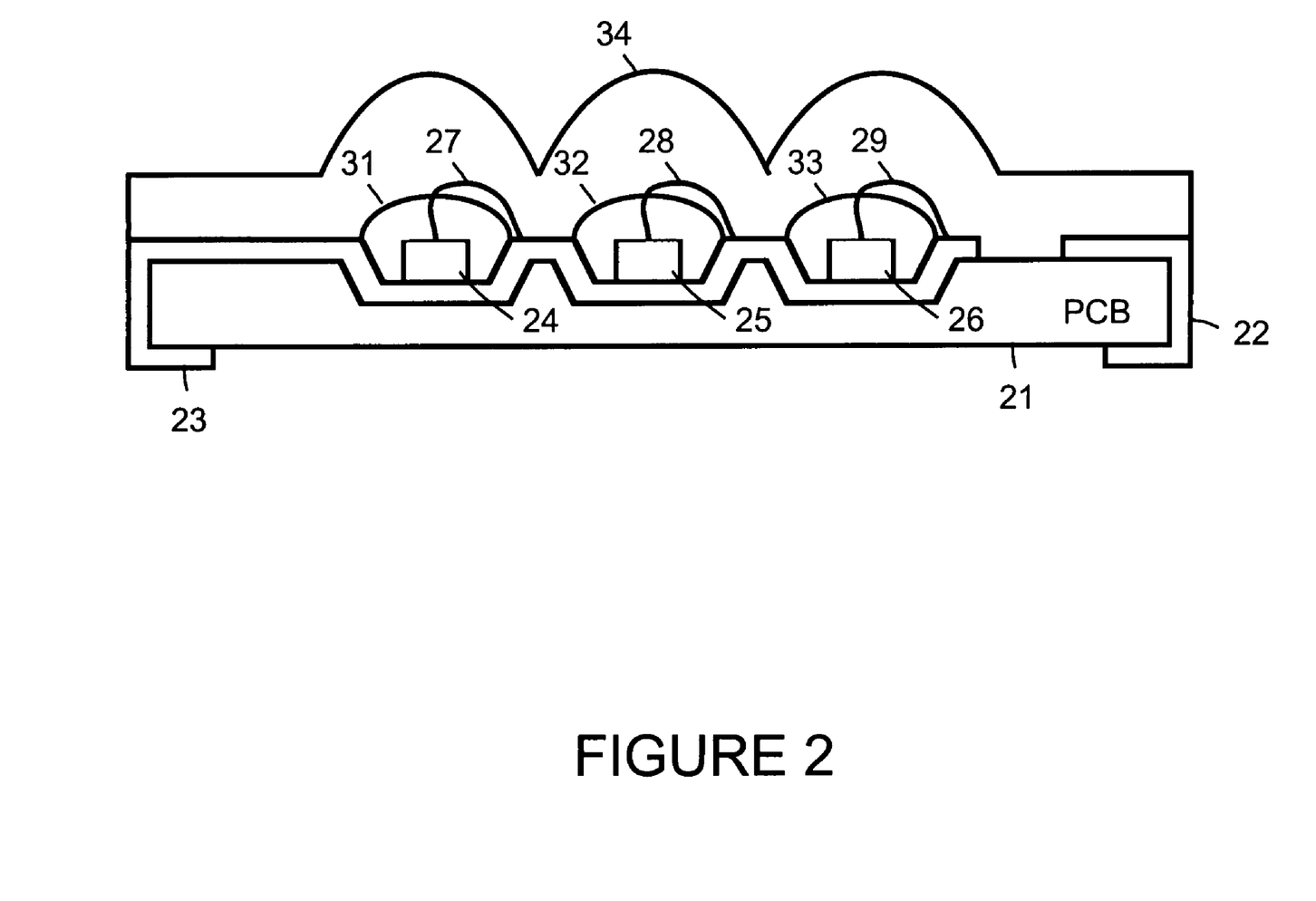
FIG. 2 shows a light emitting device, surrounded by an epoxy that includes multiple types of phosphor, packaged for use in a camera flash module in accordance with another embodiment of the present invention.

FIG. 2 shows a camera flash module having a light emitting device 24, a light emitting device 25 and a light emitting device 26 mounted on a printed circuit board (PCB) 26. A wire 27 is connected between light emitting device 24 and a contact region 23. A wire 28 is connected between light emitting device 25 and contact region 23. A wire 29 is connected between light emitting device 26 and contact region 23. A contact region 22 is also shown. The flash module is covered by a mold compound 34.

Light emitting device 24 is covered by an epoxy 31 that includes multiple types of phosphor. For example, epoxy 31 is a liquid epoxy that includes green phosphor and yellow phosphor. Light emitting device 25 is covered by an epoxy 32 that includes green phosphor and yellow phosphor. Light emitting device 26 is covered by an epoxy 33 that includes green phosphor and yellow phosphor.

For example, light emitting device 24, light emitting device 25 and light emitting device 26 are each blue LED chips. The mixture of green phosphor plus yellow phosphor plus the blue LED allows color ranges from bluish-green to greenish-white to yellowish-green to be obtained. By adjusting the mixture and ratio of green phosphor and yellow phosphor, a wide variety of colors in this color spectrum can be obtained.

For example, the green phosphor is Strontium Thiogallate: Europium, having a chemical formula of $SrGa_2S_4$:Eu. The green phosphor is spherical in shape and has a mean particle size ranging from 1 micron (μm) to 30 μm. The green phosphor can be efficiently excited by a blue light source generating a blue light with a wavelength from a range of 460 nanometers (nm) to 480 nm. Thus excited, the green phosphor emits green light with peak emission at a wavelength of 535 nm (CIE 1931 color coordinates x=0.270, y=0.683). Alternatively, the green phosphor can have a different chemical formula. For example, the green phosphor can include $BaGa_4S_7$:Eu, or a wider coverage of the thiogallate phosphor that is a mix group II alkaline metal thiogallate phosphor $(Sr,Ca,Ba)(Al,Ga)_2S_4$:Eu; $BaSrGa_4S_7$:Eu.

For example, the yellow phosphor has a chemical formula of $Tb_3Al_5O_{12}$:Ce. The yellow phosphor is spherical in shape and has a mean particle size ranging from 1 μm to 30 μm. The yellow phosphor can be efficiently excited by a blue light source generating a blue light with a wavelength from a range of 460 nanometers (nm) to 480 nm. Thus excited, the yellow phosphor emits yellow light with peak emission at a wavelength of 575 nm (CIE 1931 color coordinates x=0.467, y=0.522). Alternatively, the yellow phosphor can include a silicate based phosphor such as $Sr(Ba,Ca)SiO_4$:Eu and can also include YAG:Ce.

For example, light emitting device 24, light emitting device 25 and light emitting device 26 emit blue light with peak wavelength ranges from 460 nm to 480 nmn.

Alternatively, other color phosphors and light emitting device may be utilized. For example, using red phosphor in combination with yellow phosphor, allows other color ranges to be obtained. For example, the red phosphor can be composed of a sulfide based phosphor such as one of the following: $CaS:Eu^{2+},Mn^{2+}$; $SrS:Eu^{2+}$; $(Zn,Cd)S:Ag^+$; $ZnS:Cu^+$; ZnSe:Cu, Cl; $ZnSe_{1/2}S_{1/2}$:Cu,Cl. The red phosphor can also be nitride base with, for example, a chemical formula of: $(Ca,Sr,Ba)_2Si_5N_8:Eu^{2+}$; $BaSi_7N_{10}:Eu^{2+}$. The red phosphor also can be composed of other phosphors such as $Mg_4GeO_{5.5}F:Mn^{4+}$.

Figure 3:
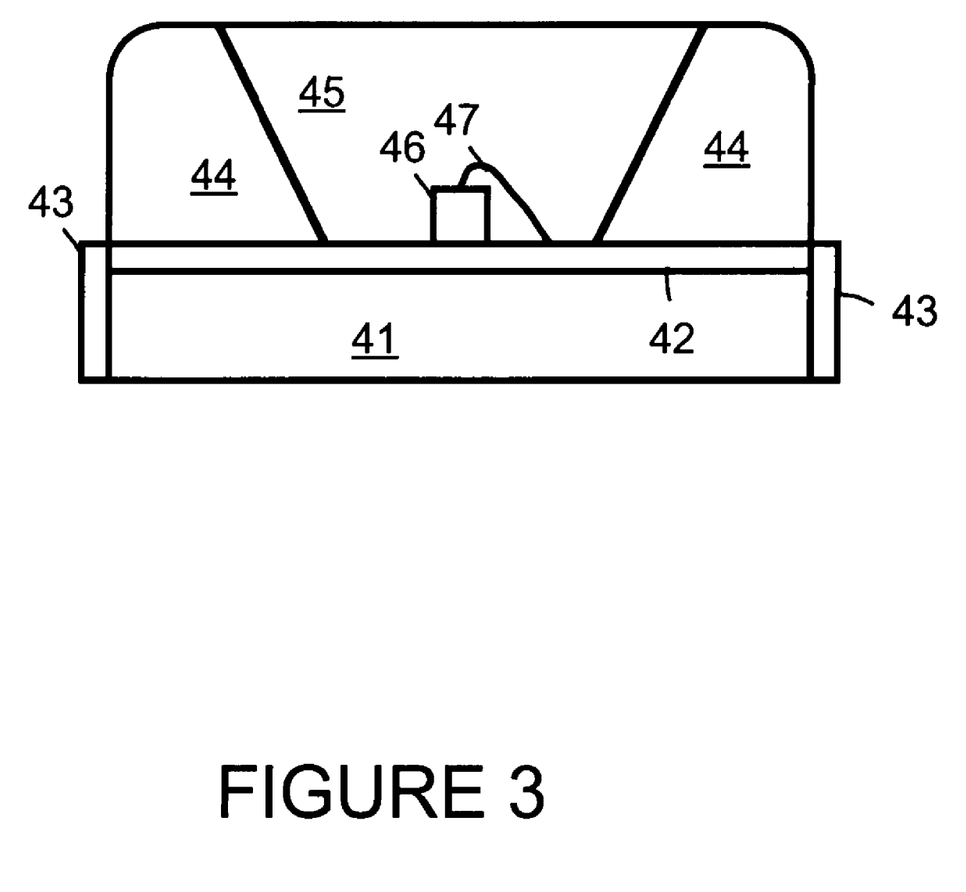
FIG. 3 shows a light emitting device, surrounded by an epoxy that includes multiple types of phosphor, shown used in a lighting system used in an automotive dashboard in accordance with another embodiment of the present invention.

FIG. 3 shows a portion of an automotive dashboard. A substrate 41 includes an electrode 42 and electrodes 43. A light emitting device 46 is mounted over electrode 42. A wire 47 is connected between light emitting device 46 and electrode 42. Walls 44 define a region in which is placed an epoxy 45. Epoxy 45 includes multiple types of phosphor. For example, epoxy 45 is a liquid epoxy that includes green phosphor and yellow phosphor. For example, light emitting device 46 is a blue LED chip. The mixture of green phosphor plus yellow phosphor plus the blue LED chip allows color ranges from bluish-green to greenish-white to yellowish-green to be obtained. By adjusting the mixture and ratio of green phosphor and yellow phosphor, a wide variety of colors in this color spectrum can be obtained. Alternatively, other color phosphors and light emitting device may be utilized.

For example, the green phosphor is Strontium Thiogallate: Europium, having a chemical formula of $SrGa_2S_4$:Eu. Alternatively, the green phosphor can have a different chemical formula. For example, the green phosphor can include $BaGa_4S_7$:Eu, or a wider coverage of the thiogallate phosphor that is a mix group II alkaline metal thiogallate phosphor $(Sr,Ca,Ba)(Al,Ga)_2S_4$:Eu; $BaSrGa_4S_7$:Eu.

For example, the yellow phosphor has a chemical formula of $Tb_3Al_5O_{12}$:Ce. Alternatively, the yellow phosphor can include a silicate based phosphor such as $Sr(Ba,Ca)SiO_4$:Eu and can also include YAG:Ce. Red phosphor can also be used. The red phosphor can be composed of a sulfide based phosphor such as one of the following: $CaS:Eu^{2+},Mn^{2+}$; $SrS:Eu^{2+}$; $(Zn,Cd)S:Ag^+$; $ZnS:Cu^+$; ZnSe:Cu, Cl; $ZnSe_{1/2}S_{1/2}$:Cu,Cl. The red phosphor can also be nitride base with, for example, a chemical formula of: $(Ca,Sr,Ba)_2Si_5N_8:Eu^{2+}$; $BaSi_7N_{10}:Eu^{2+}$. The red phosphor also can be composed of other phosphors such as $Mg_4GeO_{5.5}F:Mn^{4+}$.

For example, light emitting device 46 emits blue light with peak wavelength ranges from 460 nm to 480 nm.

Figure 4:
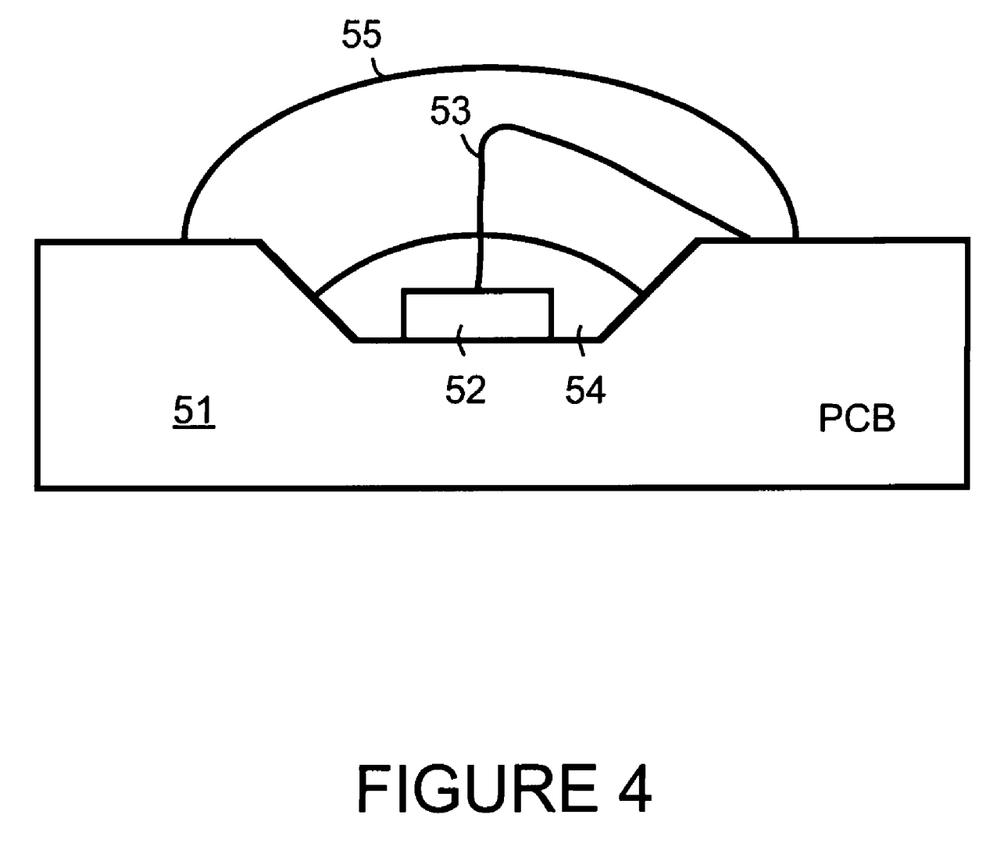
FIG. 4 shows a light emitting device, surrounded by an epoxy that includes multiple types of phosphor, shown used in a high power printed circuit board (PCB) surface mount application in accordance with another embodiment of the present invention.

FIG. 4 shows a light emitting device 52, placed in a high power (e.g. 1 Watt) surface mount configuration on a PCB 51. A wire 53 is connected between light emitting device 52 and PCB 51. Epoxy 54 includes multiple types of phosphor. For example, epoxy 54 is a liquid epoxy that includes green phosphor and yellow phosphor. A mold compound 55 is placed over epoxy 54. For example, light emitting device 52 is a blue LED chip. The mixture of green phosphor plus yellow phosphor plus the blue LED chip allows color ranges from bluish-green to greenish-white to yellowish-green to be obtained. By adjusting the mixture and ratio of green phosphor and yellow phosphor, a wide variety of colors in this color spectrum can be obtained. Alternatively, other color phosphors, such as a red phosphor, and light emitting device may be utilized.

For example, the green phosphor is Strontium Thiogallate: Europium, having a chemical formula of $SrGa_2S_4$:Eu. Alternatively, the green phosphor can have a different chemical formula. For example, the green phosphor can include $BaGa_4S_7$:Eu, or a wider coverage of the thiogallate phosphor that is a mix group II alkaline metal thiogallate phosphor $(Sr,Ca,Ba)(Al,Ga)_2S_4$:Eu; $BaSrGa_4S_7$:Eu.

For example, the yellow phosphor has a chemical formula of $Tb_3Al_5O_{12}$:Ce. Alternatively, the yellow phosphor can include a silicate based phosphor such as $Sr(Ba,Ca)SiO_4$:Eu and can also include YAG:Ce. Red phosphor can also be used. The red phosphor can be composed of a sulfide based phosphor such as one of the following: $CaS:Eu^{2+},Mn^{2+}$; $SrS:Eu^{2+}$; $(Zn,Cd)S:Ag^+$; $ZnS:Cu^+$; ZnSe:Cu, Cl; $ZnSe_{1/2}S_{1/2}$:Cu,Cl. The red phosphor can also be nitride base with, for example, a chemical formula of: $(Ca,Sr,Ba)_2Si_5N_8:Eu^{2+}$; $BaSi_7N_{10}:Eu^{2+}$. The red phosphor also can be composed of other phosphors such as $Mg_4GeO_{5.5}F:Mn^{4+}$.

For example, light emitting device 52 emits blue light with peak wavelength ranges from 460 nm to 480 nm.

Figure 5:
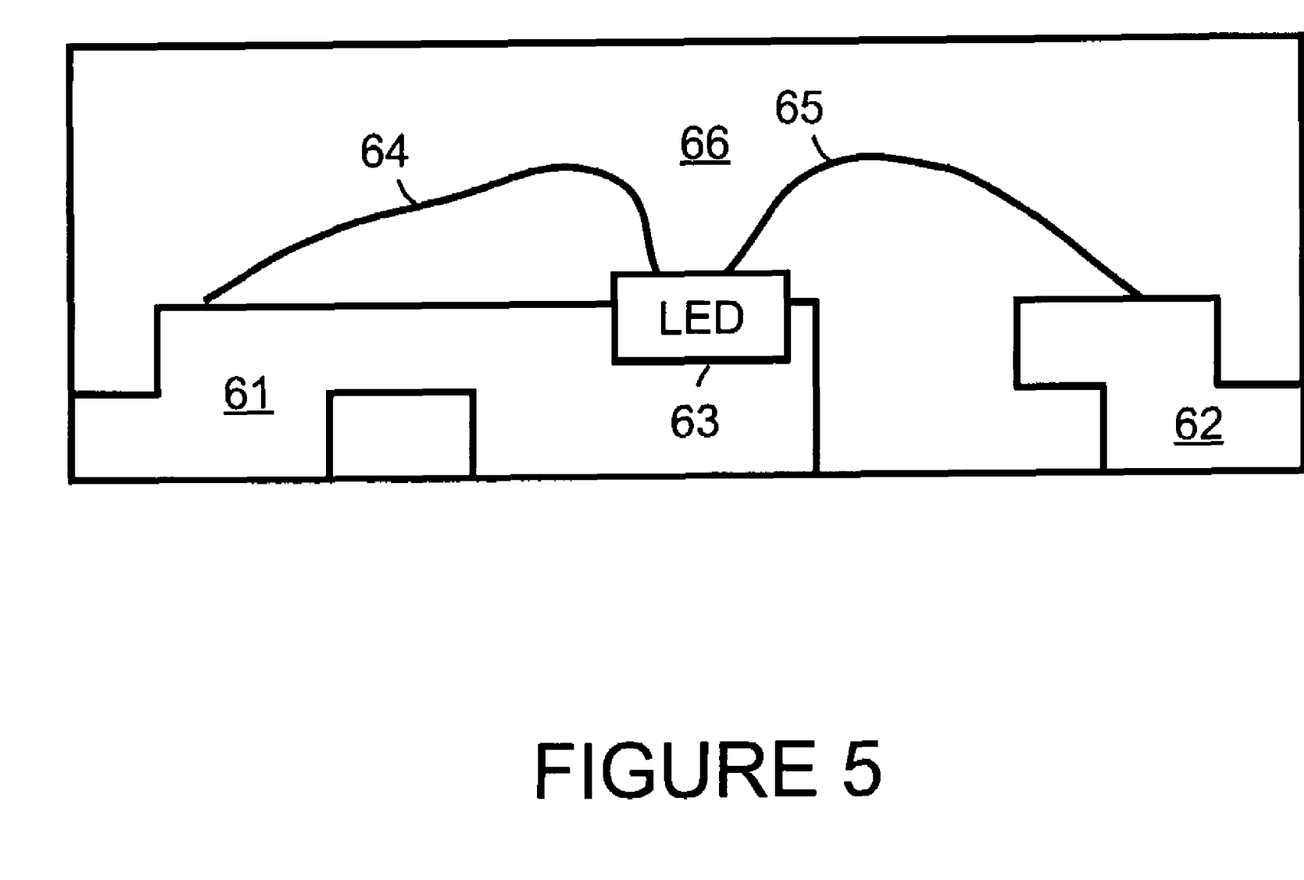
FIG. 5 shows a light emitting device, surrounded by an epoxy that includes multiple types of phosphor, packaged in a lead frame surface mount application in accordance with another embodiment of the present invention.

FIG. 5 shows a light emitting device 63 placed in a surface mount configuration on a leadframe portion 61. A wire 64 is connected between light emitting device 63 and leadframe portion 61. A wire 65 is connected between light emitting device 63 and a leadframe portion 62. Epoxy 66 includes multiple types of phosphor. For example, epoxy 66 is a liquid epoxy that includes green phosphor and yellow phosphor. For example, light emitting device 63 is a blue LED chip. The mixture of green phosphor plus yellow phosphor plus the blue LED chip allows color ranges from bluish-green to greenish-white to yellowish-green to be obtained. By adjusting the mixture and ratio of green phosphor and yellow phosphor, a wide variety of colors in this color spectrum can be obtained. Alternatively, other color phosphors and light emitting device may be utilized.

For example, the green phosphor is Strontium Thiogallate: Europium, having a chemical formula of $SrGa_2S_4$:Eu. Alternatively, the green phosphor can have a different chemical formula. For example, the green phosphor can include $BaGa_4S_7$:Eu, or a wider coverage of the thiogallate phosphor that is a mix group II alkaline metal thiogallate phosphor $(Sr,Ca,Ba)(Al,Ga)_2S_4$:Eu; $BaSiGa_4S_7$:Eu.

For example, the yellow phosphor has a chemical formula of $Tb_3Al_5O_{12}$:Ce. Alternatively, the yellow phosphor can include a silicate based phosphor such as $Sr(Ba,Ca)SiO_4$:Eu and can also include YAG:Ce. Red phosphor can also be used. The red phosphor can be composed of a sulfide based phosphor such as one of the following: $CaS:Eu^{2+},Mn^{2+}$; $SrS:Eu^{2+}$; $(Zn,Cd)S:Ag^+$; $ZnS:Cu^+$; $ZnSe:Cu, Cl$; $ZnSe_{1/2}S_{1/2}:Cu,Cl$. The red phosphor can also be nitride base with, for example, a chemical formula of: $(Ca,Sr,Ba)_2Si_5N_8:Eu^{2+}$; $BaSi_7N_{10}:Eu^{2+}$. The red phosphor also can be composed of other phosphors such as $Mg_4GeO_{5.5}F:Mn^{4+}$.

For example, light emitting device 63 emits blue light with peak wavelength ranges from 460 nm to 480 nm.

Figure 6:
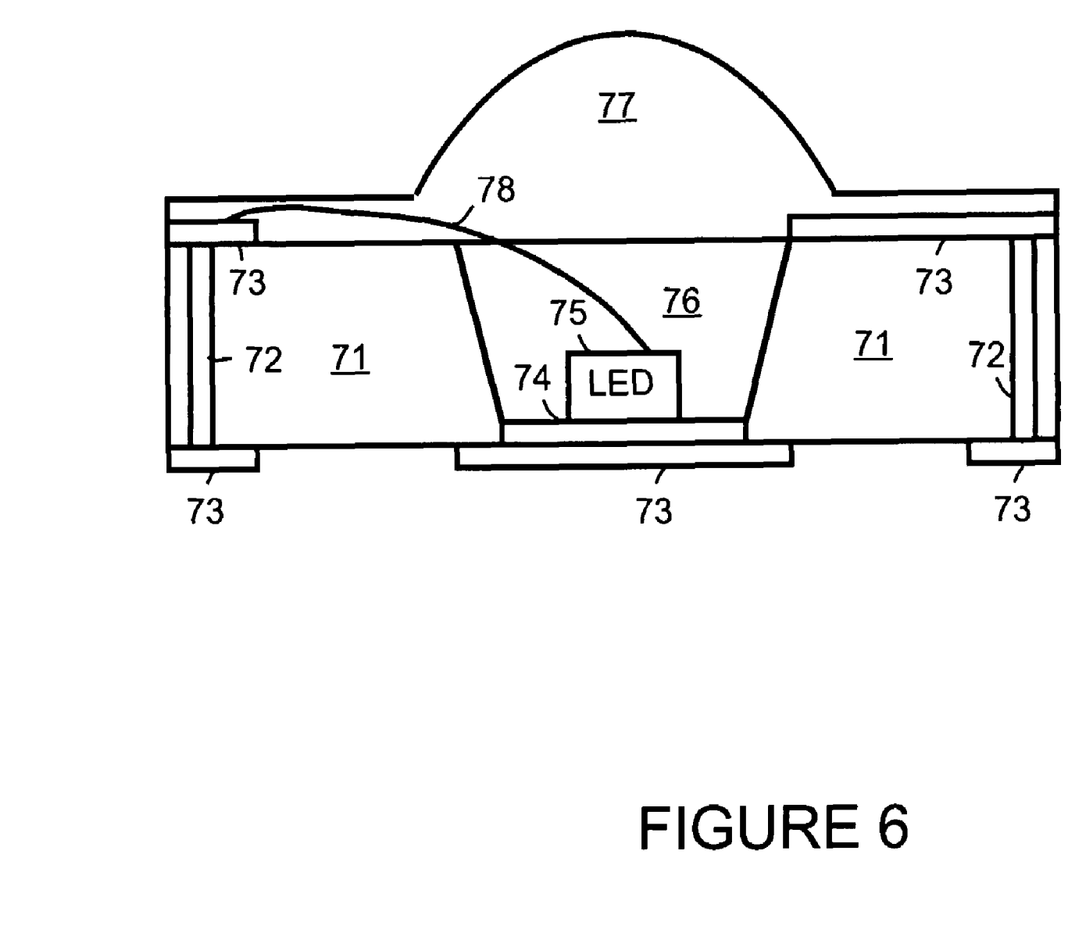
FIG. 6 shows a light emitting device, surrounded by an epoxy that includes multiple types of phosphor, mounted within a PCB in accordance with another embodiment of the present invention.

FIG. 6 shows a light emitting device 75 mounted on a heat sink 74 within a PCB substrate 71. Vias 72 through PCB substrate 71 make connections between contacts 73. A wire 78 is connected between light emitting device 75 and contacts 73, as shown. Epoxy 76 includes multiple types of phosphor. For example, epoxy 76 is a liquid epoxy that includes green phosphor and yellow phosphor. An optical dome 77 is placed over epoxy 76. For example, light emitting device 75 is a blue LED chip. The mixture of green phosphor plus yellow phosphor plus the blue LED chip allows color ranges from bluish-green to greenish-white to yellowish-green to be obtained. By adjusting the mixture and ratio of green phosphor and yellow phosphor, a wide variety of colors in this color spectrum can be obtained. Alternatively, other color phosphors and light emitting device may be utilized.

For example, the green phosphor is Strontium Thiogallate: Europium, having a chemical formula of $SrGa_2S_4$:Eu. Alternatively, the green phosphor can have a different chemical formula. For example, the green phosphor can include $BaGa_4S_7$:Eu, or a wider coverage of the thiogallate phosphor that is a mix group II alkaline metal thiogallate phosphor $(Sr,Ca,Ba)(Al,Ga)_2S_4$:Eu; $BaSrGa_4S_7$:Eu.

For example, the yellow phosphor has a chemical formula of $Tb_3Al_5O_{12}$:Ce. Alternatively, the yellow phosphor can include a silicate based phosphor such as $Sr(Ba,Ca)SiO_4$:Eu and can also include YAG:Ce. Red phosphor can also be used. The red phosphor can be composed of a sulfide based phosphor such as one of the following: $CaS:Eu^{2+},Mn^{2+}$; $SrS:Eu^{2+}$; $(Zn,Cd)S:Ag^+$; $ZnS: Cu^+$; $ZnSe:Cu, Cl$; $ZnSe_{1/2}S_{1/2}:Cu,Cl$. The red phosphor can also be nitride base with, for example, a chemical formula of: $(Ca,Sr,Ba)_2Si_5N_8:Eu^{2+}$; $BaSi_7N_{10}:Eu^{2+}$. The red phosphor also can be composed of other phosphors such as $Mg_4GeO_{5.5}F:Mn^{4+}$.

For example, light emitting device 75 emits blue light with peak wavelength ranges from 460 nm to 480 nm.

Figure 7:
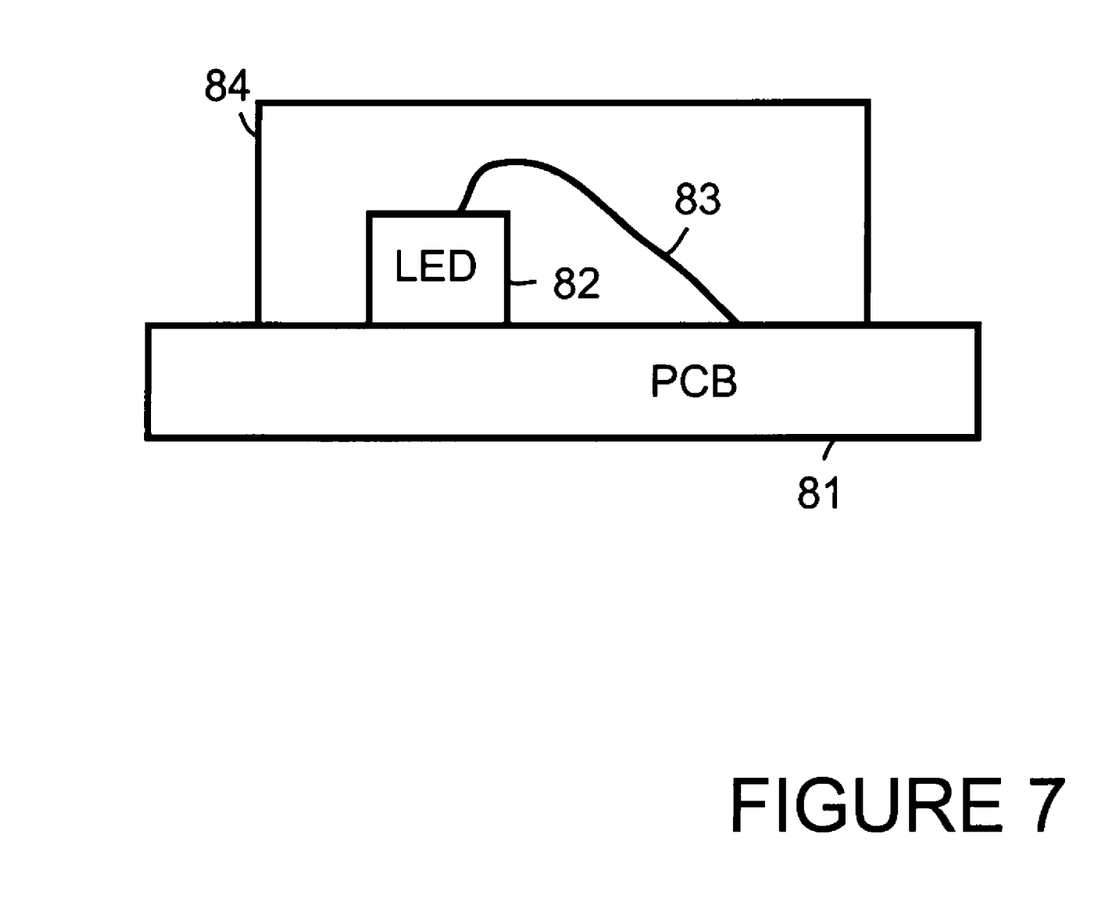
FIG. 7 shows a light emitting device, surrounded by an epoxy that includes multiple types of phosphor, packaged for use as backlighting in accordance with another embodiment of the present invention.

FIG. 7 shows a light emitting device 82 mounted on a PCB 81 in a configuration used, for example, to provide backlighting for a device such as a phone or personal digital assistant (PDA). A wire 83 is connected between light emitting device 82 and PCB 81. Epoxy 84 includes multiple types of phosphor. For example, epoxy 84 is a liquid epoxy that includes green phosphor and yellow phosphor. For example, light emitting device 82 is a blue LED chip. The mixture of green phosphor plus yellow phosphor plus the blue LED chip allows color ranges from bluish-green to greenish-white to yellowish-green to be obtained. By adjusting the mixture and ratio of green phosphor and yellow phosphor, a wide variety of colors in this color spectrum can be obtained. Alternatively, other color phosphors and light emitting device may be utilized.

For example, the green phosphor is Strontium Thiogallate: Europium, having a chemical formula of $SrGa_2S_4$:Eu. Alternatively, the green phosphor can have a different chemical formula. For example, the green phosphor can include $BaGa_4S_7$:Eu, or a wider coverage of the thiogallate phosphor that is a mix group II alkaline metal thiogallate phosphor $(Sr,Ca,Ba)(Al,Ga)_2S_4$:Eu; $BaSrGa_4S_7$:Eu.

For example, the yellow phosphor has a chemical formula of $Tb_3Al_5O_{12}$:Ce. Alternatively, the yellow phosphor can include a silicate based phosphor such as $Sr(Ba,Ca)SiO_4$:Eu and can also include YAG:Ce. Red phosphor can also be used. The red phosphor can be composed of a sulfide based phosphor such as one of the following: $CaS:Eu^{2+},Mn^{2+}$; $SrS:Eu^{2+}$; $(Zn,Cd)S:Ag^+$; $ZnS:Cu^+$; $ZnSe:Cu, Cl$; $ZnSe_{1/2}S_{1/2}:Cu,Cl$. The red phosphor can also be nitride base with, for example, a chemical formula of: $(Ca,Sr,Ba)_2Si_5N_8:Eu^{2+}$; $BaSi_7N_{10}:Eu^{2+}$. The red phosphor also can be composed of other phosphors such as $Mg_4GeO_{5.5}F:Mn^{4+}$.

For example, light emitting device 82 emits blue light with peak wavelength ranges from 460 nm to 480 nm.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A light generating device comprising:
   a blue light emitting device that emits blue light with peak wavelength within a range from 460 nanometers (nm) to 480 nm; and,
   an epoxy placed over the light emitting device, the epoxy including:
      a first type of phosphor; and
      a second type of phosphor;
   wherein the first type of phosphor, when excited, emits red light; and,
   wherein the second type of phosphor is $Sr(Ba,Ca)SiO_4$:Eu, which when excited, emits yellow light.

2. A light generating device as in claim 1 additionally comprises one of the following:
   a mold compound covering the epoxy;
   an optical dome covering the epoxy.

3. A light generating device as in claim 1:
   wherein the first type of phosphor is a red phosphor having one of the following chemical formulas:

$CaS:Eu^{2+},Mn^{2+}$, $(Zn,Cd)S:Ag^+$, $Mg_4GeO_{5.5}F:Mn^{4+}$, $ZnS:Cu^+$,

ZnSe:Cu, Cl,

ZnSe$_{1/2}$S$_{1/2}$:Cu,Cl, and

BaSi$_7$N$_{10}$:Eu$^{2+}$.

4. A light generating device as in claim 1 additionally comprising:
   a second light emitting device; and,
   a second epoxy placed over the second light emitting device, the second epoxy including:
   the first type of phosphor, and
   the second type of phosphor.

5. A light generating device as in claim 1 additionally comprising:
   a second light emitting device;
   a second epoxy placed over the second light emitting device, the second epoxy including:
   the first type of phosphor, and
   the second type of phosphor;
   a third light emitting device; and,
   a third epoxy placed over the third light emitting device, the third epoxy including:
   the first type of phosphor, and
   the second type of phosphor.

6. A light generating device as in claim 1, wherein the light emitting device is mounted on one of the following:
   a printed circuit board;
   a lead frame.

7. A light generating device as in claim 1, wherein the light emitting device is mounted within a printed circuit board substrate.

8. A light generating device comprising:
   emitting means for emitting blue light with peak wavelength within a range from 460 nanometers (nm) to 480 nm; and,
   holding means for holding a first type of phosphor and a second type of phosphor adjacent to the emitting means;
   wherein the first type of phosphor, when excited, emits red light; and,
   wherein the second type of phosphor is Sr(Ba,Ca)SiO$_4$:Eu, which when excited, emits yellow light.

9. A light generating device as in claim 8:
   wherein the first type of phosphor is a red phosphor having one of the following chemical formulas:

CaS:Eu$^{2+}$,Mn$^{2+}$, (Zn,Cd)S:Ag$^+$,

Mg$_4$GeO$_{5.5}$F:Mn$^{4+}$,

ZnS: Cu$^+$,

ZnSe:Cu, Cl,

ZnSe$_{1/2}$S$_{1/2}$:Cu,Cl,

BaSi$_7$N$_{10}$:Eu$^{2+}$.

10. A light generating device as in claim 8, wherein the emitting means is mounted on one of the following:
    a printed circuit board;
    a lead frame.

11. A light generating device as in claim 8, wherein the emitting means is mounted within a printed circuit board substrate.

12. A light generating device comprising:
    a blue light emitting device that emits blue light with peak wavelength within a range from 460 nanometers (nm) to 480 nm; and,
    an epoxy placed over the light emitting device, the epoxy including:
    a first type of phosphor; and
    a second type of phosphor;
    wherein the first type of phosphor, when excited, emits green light; and,
    wherein the second type of phosphor, when excited, emits yellow light.

13. The light generating device of claim 12, wherein the first type of phosphor is SrGa$_2$S$_4$:Eu.

14. The light generating device of claim 13, wherein the first type of phosphor comprises spherical phosphor particles having a mean particle size ranging from about 1 μm to about 30 μm.

15. The light generating device of claim 12, wherein the first type of phosphor comprises BaGa$_4$S$_7$:Eu.

16. The light generating device of claim 12, wherein the first type of phosphor is (Sr,Ca,Ba)(Al,Ga)$_2$S$_4$:Eu; BaGa$_4$S$_7$:Eu.

* * * * *